United States Patent [19]

Akbar

[11] Patent Number: 5,656,845
[45] Date of Patent: Aug. 12, 1997

[54] EEPROM ON INSULATOR

[75] Inventor: Shahzad Akbar, Colorado Springs, Colo.

[73] Assignee: Atmel Corporation, San Jose, Calif.

[21] Appl. No.: 400,613

[22] Filed: Mar. 8, 1995

[51] Int. Cl.$^6$ .............. H01L 27/01; H01L 27/12; H01L 31/0392; H01L 29/788
[52] U.S. Cl. .............. 257/347; 257/315
[58] Field of Search .............. 257/347, 315

[56] References Cited

U.S. PATENT DOCUMENTS

| | | | |
|---|---|---|---|
| 5,125,007 | 6/1992 | Yamaguchi et al. | 357/23.7 |
| 5,166,084 | 11/1992 | Pfiester | 437/40 |
| 5,273,921 | 12/1993 | Neudeck et al. | 437/41 |
| 5,308,999 | 5/1994 | Gotou | 257/66 |
| 5,315,144 | 5/1994 | Cherne | 257/351 |
| 5,340,759 | 8/1994 | Hsieh et al. | 437/41 |
| 5,341,028 | 8/1994 | Yamaguchi et al. | 257/344 |
| 5,343,051 | 8/1994 | Yamaguchi et al. | 257/66 |
| 5,365,097 | 11/1994 | Kenney | 257/302 |

OTHER PUBLICATIONS

Muller et al, *Device Electronics for IC's* pp. 452–454, 1986.

*Primary Examiner*—Stephen Meier
*Attorney, Agent, or Firm*—Thomas Schneck

[57] ABSTRACT

A nonvolatile memory cell such as an EPROM or EEPROM formed with a silicon on insulator technology has immunity to latchup and punchthrough and increased transconductance. A floating gate is formed atop a thin active layer of silicon containing source, drain and channel regions, the active layer lying atop an insulative layer that shields the active layer from an underlying silicon substrate. In a preferred embodiment, a stripe-shaped split gate extends over the floating gate and a portion of the channel, the split gate employed both to control charging and discharging of the floating gate and to sense whether charge is stored on the floating gate, while occupying a smaller memory cell area.

11 Claims, 5 Drawing Sheets

EEPROM ON INSULATOR

DESCRIPTION

1. Technical Field

The present invention relates to nonvolatile semiconductor memory devices such as erasable read only memories (EPROMs) and electrically erasable read only memories (EEPROMs).

2. Background of the Invention

EPROM and EEPROM transistors provide memory capability by storing charge on electrically isolated or "floating" gates, the presence or absence of such charge on a gate then being sensed to determine whether a digital zero or one is stored at that location. Charge may be stored on a floating gate by quantum mechanical tunneling of electrons through a very thin dielectric layer that separates the floating gate from a semiconductor substrate housing source, channel and drain regions of the transistor. Alternatively, charge may be stored on a floating gate by "hot electrons" which have been accelerated from the source or substrate toward the drain, some of which have sufficient energy to traverse a dielectric layer to reach the floating gate. Charge is typically removed from a floating gate by tunneling through the dielectric layer back to the substrate.

The performance of a nonvolatile memory cell depends greatly on the thin dielectric layer separating the floating gate from the substrate, especially for the quantum mechanical tunneling mechanism. A thinner tunnel dielectric layer allows much faster tunneling of electrons, and thus a quicker or lower voltage device. For this reason, tunnel dielectric layers are often less than 150 angstroms in thickness. A small flaw in such a thin layer, however, becomes much more harmful than it would be in a thicker layer. This thin tunnel dielectric layer can also be damaged by hot carrier effects in which some electrons tunneling through the dielectric layer become trapped in that layer, thereby altering the electrical characteristics of the portion of that layer containing the trapped carriers.

"Punchthrough" of the channel region occurs when a voltage applied to the drain creates an electrical field such that the drain and source depletion regions merge, destroying the transistor action of the cell, and is more prevalent as channel length becomes shorter. Another deleterious effect, termed "latchup," occurs when elements of a transistor which are disposed in the substrate near its surface, such as diffused source and drain regions, inadvertently form p-n junctions and circuits with oppositely doped portions of the substrate below.

Problems with punchthrough and latchup have been helped in metal oxide silicon field effect transistors (MOSFETs) by using silicon on insulator (SOI) technology, in which the source, drain and channel regions of a transistor are formed in a silicon layer that is separated from the rest of the silicon substrate by a layer of silicon dioxide. Examples of SOI MOSFETs are found in U.S. Pat. No. 5,166,084 to Pfiester, U.S. Pat. No. 5,308,999 to Gotou, U.S. Pat. No. 5,315,144 to Cherne and U.S. Pat. Nos. 5,125,007, 5,341,028 and 5,343,051 to Yamaguchi et al. In these prior art transistors, gates are connected directly to electrical circuitry, eliminating the need for electrons to cross barriers to be stored on and removed from floating gates.

A difficulty in SOI transistors is the formation of high quality, single crystal silicon for the source, drain and channel regions on top of a layer of silicon dioxide, which would make the use of SOI with floating gate technologies difficult. An imperfection in a silicon layer immediately beneath a tunnel window hampers the performance, reliability and lifetime of a floating gate transistor. A defect in the silicon layer that encouraged electrons to take a particular path through the dielectric layer would tend to propagate, leading to failure of the insulating ability of that dielectric layer. A defect in a tunnel dielectric window due to its growth over imperfect silicon would be particularly harmful. In addition, the voltages applied in nonvolatile memories are typically higher than in dynamic memories, since the floating gate acquires a voltage between that of the select gate and the substrate. For hot carrier tunneling, imperfections in the source, drain or channel would tend to reduce the momentum of the hot electrons, while decreasing the depth of the active region below the gate would tend to reduce the transverse component of momentum of the electrons directed toward the drain from the source, both of which would tend to reduce tunneling of electrons onto the gate.

An object of the current invention is to overcome some of the difficulties listed above in order to provide nonvolatile semiconductor memory cells with improved performance and reliability.

SUMMARY OF THE INVENTION

The above object has been achieved with a nonvolatile transistor SOI memory cell in which a floating gate is formed atop a crystalline semiconductor active layer that is disposed atop an insulative layer, the active layer containing a source region separated from a drain region by a channel region. The conductive floating gate is separated from the active layer by a tunnel oxide or nitride layer or window. Vertically separated from the floating gate by another layer of oxide or nitride insulator is another conductive gate, termed a control gate, which controls the storage of charge on the floating gate. A select gate is located adjacent to the floating gate near the drain region, separated from the active layer by an insulative layer, the select gate employed to select the memory transistor rather than others in its column.

In a preferred embodiment, the control gate and the select gate are formed from a contiguous stripe of conductive polysilicon, a part of the stripe of polysilicon that forms the control gate lying over the polysilicon floating gate, allowing closer packing of the memory cells in an array. In this embodiment the channel is elongated and aligned beneath the stripe, the floating gate disposed over about half of the channel and the select gate disposed over the other half of the channel. Rows of such polysilicon stripes can be formed above the active region, while columns of source and drain regions perpendicular to the stripes are formed below, creating arrays of transistors with islands of field oxide therebetween.

The active layer and the insulative layer on which it is situated are preferably disposed atop a silicon substrate for strength and packaging. Such a silicon on insulator structure can be formed in several ways, with care taken to create a defect free active layer having a planar surface. The insulative layer can be formed by implanting oxygen or nitrogen atoms in a silicon wafer to form a buried dielectric layer, and then annealing the wafer to recrystallize and purify the silicon layer through which the oxygen or nitrogen was implanted. Alternatively, a buried insulative layer can be formed by wafer bonding, in which two wafers having thermally grown oxide surfaces are sandwiched together at an elevated temperature, while an electrical potential may be applied to consummate bonding of the surfaces together. Another method that may be employed to create a thin, high quality active layer on an insulative layer which is atop a substrate is to form an etch stop layer on a wafer, an insulative layer atop the etch stop layer and a thick silicon layer atop the insulative layer. The wafer is then inverted and lapped and etched to the etch stop layer, which becomes a precisely defined active layer, with the thick silicon layer disposed below.

While the present invention may require that more care be taken with forming the active layer and tunnel window than in conventional EEPROMs, the advantages to this EEPROM on SOI technology are numerous. Latchup is averted, as the cell is electrically isolated from the substrate. Punchthrough is also decreased, as punchthrough typically occurs along the channel near the junction depths of the implanted source and drain, where the insulative layer of the present invention is located. Punchthrough between adjacent transistors is also prevented, which is particularly advantageous for the embodiment having contiguous control and select gate stripes over interconnected rows of transistors. And transconductance of the memory cell is improved, improving performance without the need to decrease channel length, which is helpful for lithography and for avoiding some short channel effects.

BEST MODE FOR CARRYING OUT THE INVENTION

Figure 1:
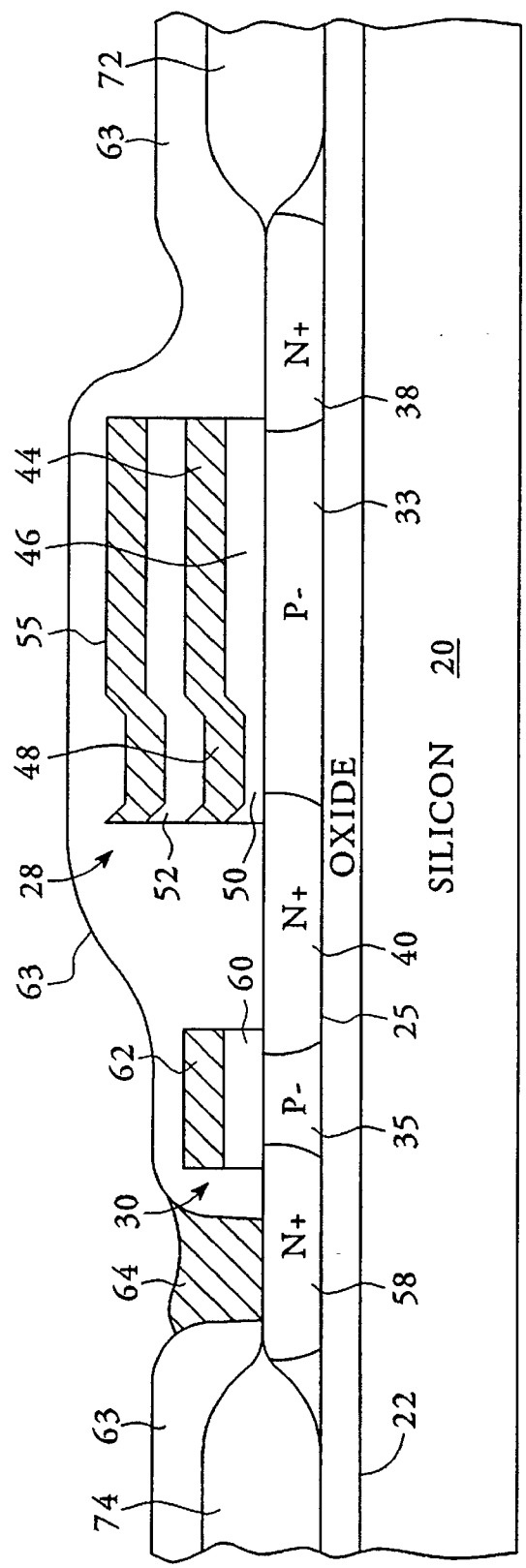
FIG. 1 is a side cross-sectional view of a silicon on insulator EEPROM cell of the present invention.

With reference to FIG. 1, a cross-sectional view of an n-channel EEPROM on insulator of the present invention has a silicon substrate 20 or wafer on which an oxide layer 22 is disposed. Although an n-channel device is illustrated, extrapolation to p-channel and CMOS devices is easily accomplished by one skilled in the art. Also, although enhancement type transistors having channel regions opposite in conductivity type to adjacent source and drain regions are depicted, depletion type transistors having channel regions of the same conductivity type as more heavily doped source and drain regions are also included in the present invention, with the understanding that the operation of p-channel or depletion type transistors is essentially logically opposite to that of n-channel enhancement type transistors.

Atop the oxide layer 22 is an active layer 25 of single crystal silicon which contains source, drain and channel regions for a memory transistor 28 and a select transistor 30. The oxide layer 22 and the active layer 25 may both be approximately 1.0 μm in thickness, depending upon formation methods and device requirements. P-type regions of the single crystal silicon form a channel 33 of the memory transistor 28 and a channel 35 of the select transistor 30. Heavily doped n-type regions acting as a source 38 and a drain 40 of the memory transistor 28 are formed of self aligned implants of arsenic that are diffused under edges of a conductive floating gate 44. Most of the floating gate 44 is separated from the active layer 25 by a first gate oxide layer 46, while a sunken section 48 of that gate 44 adjacent to the drain 40 is separated from the active region 25 by a much thinner tunnel oxide layer or window 50. The first gate oxide layer 46 has a thickness in a range between about 500 and 1000 angstroms, while the sunken section 48 may be separated from the active region 25 by a tunnel oxide stripe 50 with a thickness in a range between 50 and 150 angstroms.

Disposed atop the floating gate 44 is a second gate oxide layer 52 which separates the floating gate 44 from a conductive control gate 55. The adjacent select transistor 30 has an n-type drain 58 disposed distal to the memory transistor 28, while the drain 40 of the memory transistor also serves as a source 40 of the select transistor 30. A third gate oxide layer 60 separates a select gate 62 from the active region 25. The second and third gate oxide layers, 52 and 60, may each have a thickness in a range between about 0.2 and 0.5 μm. The floating gate 44, the control gate 55 and the select gate 62 may each be formed of n-type polysilicon having a thickness in a range between about 1.0 and 3.0 μm. A glass layer 63 covers and insulates the gates 44, 55 and 62, while a via in the glass layer is filled with a metal wire 64 that contacts drain 58.

Figure 2:
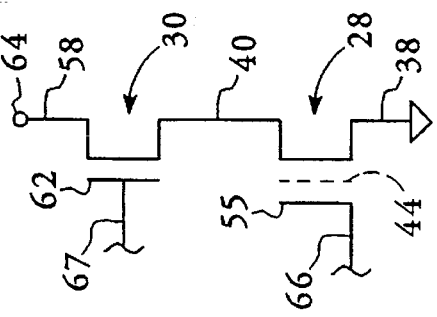
FIG. 2 is a circuit diagram of the EEPROM cell of FIG. 1.

With reference to FIG. 2, a circuit diagram of the device of FIG. 1 shows the memory transistor 28 in series with the select transistor 30, the drain 40 of the memory transistor 28 also serving as the source 40 of the select transistor 30. The floating gate 44 of the memory transistor 28 is shown as a dashed line, and the control gate 55 is connected to a sense enable and program line 66, while the source 38 of that transistor 28 is connected to ground. The select gate 62 is connected to a word select line 67, and the drain. 58 of the select transistor 30 is addressed by wire 64.

Figure 3:
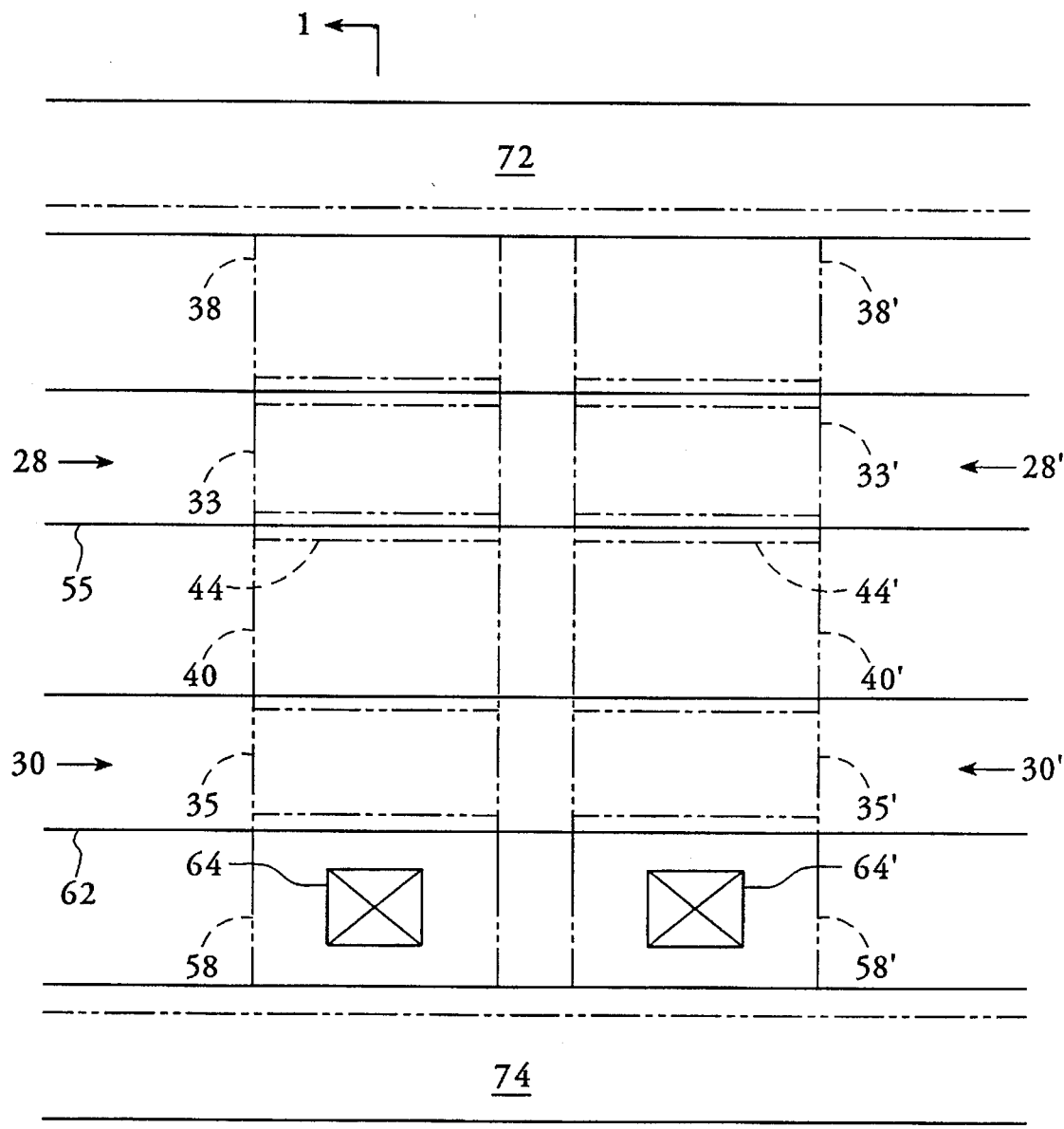
FIG. 3 is a top view of the EEPROM cell of FIG. 1 and an adjacent EEPROM cell of an array.

FIG. 3 shows a portion of an array of memory cells of the type shown in FIG. 1, viewed from the top. A first memory transistor 28 which was shown in FIG. 1 has a subsurface source 38, drain 40 and channel 33. Beneath these implanted regions is an insulative layer, not shown in this figure, that separates the active layer from the deeper substrate. Above the channel region 33 and edges of the source 38 and drain 40 is a floating gate 44, and above the floating gate 44 is a control gate 55. A first select transistor 30 in series with memory transistor 28 has a drain 58, a channel 35 and a source 40 that is the same implanted region as the drain 40 of memory transistor 28. A select gate 62 is situated in a field effect relationship over the channel 35, and a wire 64 contacts the drain 58.

A similar source 38', drain 40' and channel 33' are found in an active region of a second memory transistor 28'. Above the channel 33' and edges of the source 38' and drain 40' is a floating gate 44'. A second select transistor 30' has a source 40' shared with the drain 40' of the respective memory transistor 28', a channel 35' and a drain 58' with a contact 64'. The second memory transistor 28' shares the control gate 55 and source line 70 with the first memory transistor 28, and the second select transistor 30' shares the select gate 62 with the first select transistor 30. Field oxide rows 72 and 74 define the ends of each memory cell. As shown in FIG. 1, due to the thinness of active region 25, field oxide rows 72 and 74 effectively isolate the memory cells from adjacent memory cells, not shown, disposed beyond those field oxide rows 72 and 74, preventing inadvertent communication between the cells under the field oxide. Note that the embodiment shown in FIGS. 1–3 may be an EPROM rather than an EEPROM memory device and array, the EPROM being erased by exposure to ultraviolet light from above, which creates electron-hole pairs in silicon dioxide to allow discharge from the gate.

Figure 4:
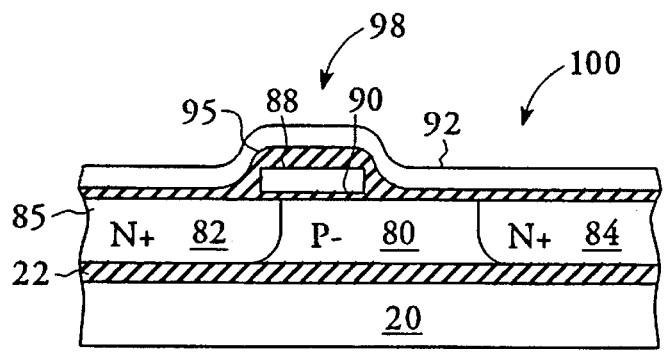
FIG. 4 is a cross-sectional view of a split gate silicon on insulator EEPROM cell of the present invention.

FIG. 4 shows a split gate memory cell embodiment of the present invention that allows closer packing of memory cells by sharing a channel region of a memory transistor and a select transistor, rather than the sharing of a source of the select transistor with a drain of the memory transistor which was disclosed in the previous embodiment. In this embodiment, as with the previous embodiment, a substrate 20 which may be a portion of a silicon wafer, is covered with an oxide layer 22. A p-type channel 80 is, however, longer than either of the channels 33 and 35 of the previous embodiment. An n-type drain 82 and source 84 are disposed at opposite ends of the channel 80, the source 84, drain 82 and channel 80 all contained within a high quality active layer 85 of single crystal silicon. A polycrystalline floating gate 88 is shown over a part of the channel 80 and an edge of the drain 82, separated from the active region 85 by a thin tunnel oxide layer 90, which has a thickness preferably in a range between 50 and 150 angstroms. The tunnel oxide layer 90 is located under the entire floating gate 88, as opposed to the tunnel oxide stripe 50 of the previous embodiment, but it is noted that either a tunnel oxide layer or stripe or a tunnel oxide window, not shown, that is smaller in every dimension than an overlying floating gate may be used in either this or the previous embodiment.

Overlying the floating gate 88 is an n-type polycrystalline split gate 92 that acts as both a control gate and a select gate. The split gate 92 is separated from the floating gate 88 and the active region 85 by an insulating layer 95 that is much thicker than the tunnel oxide layer 90, the layer 95 having a thickness preferably between 200 and 500 angstroms. The channel 80 is influenced by both the floating gate 88, which is disposed above about half of the channel 80, and the split gate 92, a portion of which is located over the other half of the channel 80. The insulating layer 95 is preferably oxide over the channel 80, and preferably oxide-nitride-oxide (ONO) over the floating gate 88.

Figure 5:
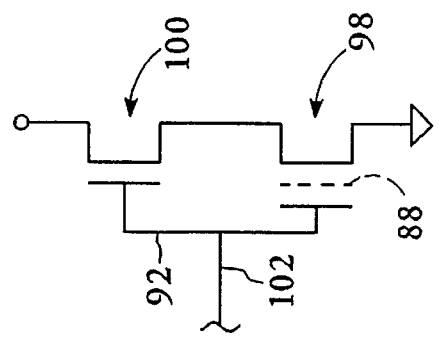
FIG. 5 is a circuit diagram of the EEPROM cell of FIG. 4.

As can be seen in FIG. 5, which is a diagram of the memory cell of FIG. 4, a memory transistor 98 having the floating gate 88 is essentially in series with a select transistor 100, while a read-write line 102 is connected to the split gate 92. The memory transistor 98 and select transistor 100 are in series because the channel 80 of this enhancement mode cell will only conduct at reading voltages when both the floating gate 88 and the split gate 92 overlying the channel have inverted the electric field of the channel 80 in their respectively influenced halves of the channel. Thus, the memory cell embodiment of FIGS. 4 and 5 operates much like the memory cell embodiment of FIGS. 1 and 2, but memory transistor 98 and select transistor 100 share a channel 80 rather than a source and drain, eliminating the space required for the shared source and drain 40 of the previous embodiment.

Figure 6:
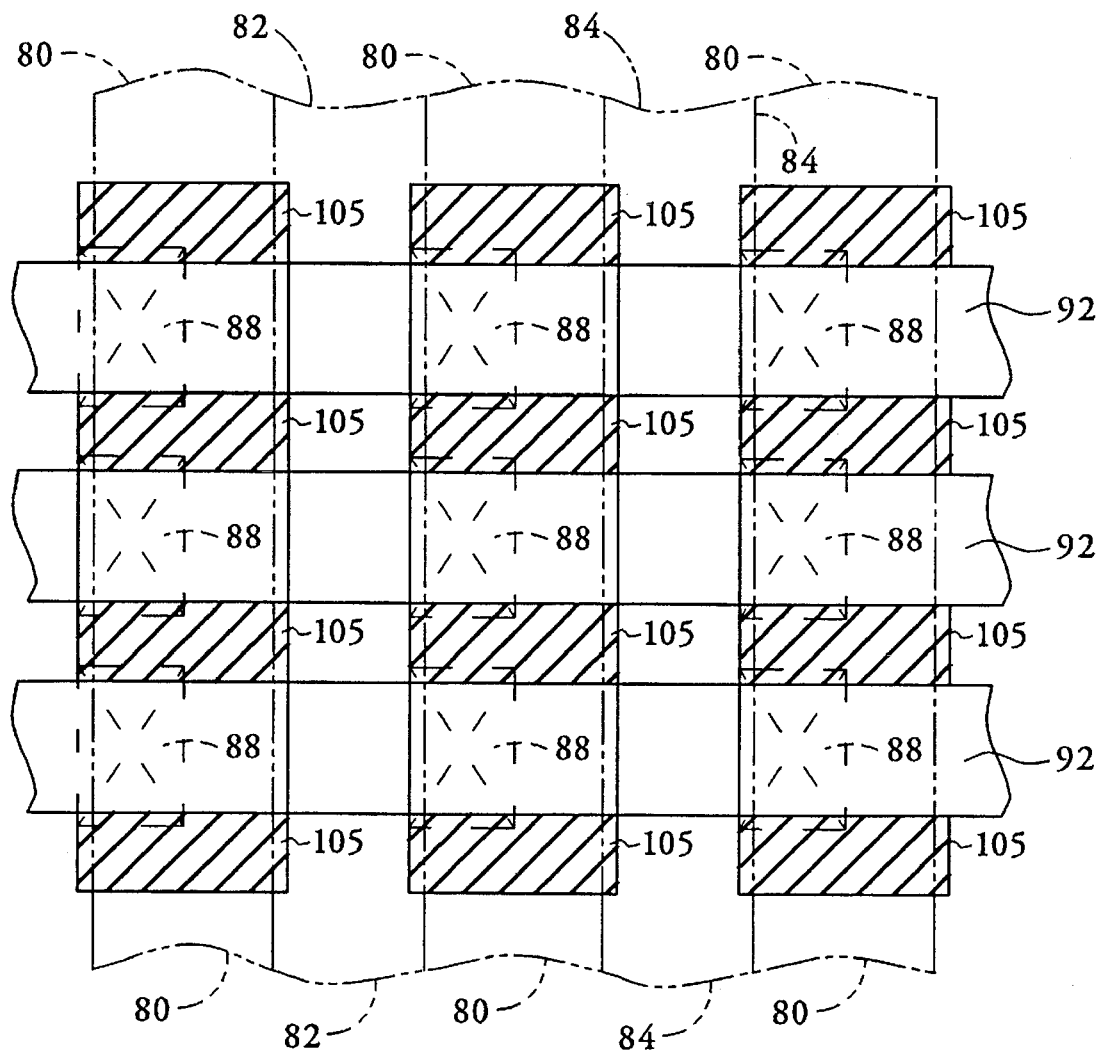
FIG. 6 is a top view of an array of EEPROM cells of FIG. 4.

Referring now to FIG. 6, an array of split gate memory cells is seen from the top to be arranged in a densely packed rectangular lattice. Although not shown in this view, this lattice is formed atop an insulative layer, with a supporting substrate disposed beneath the insulative layer. Channel region 80, drain region 82 and source region 84 are essentially parallel columns in which ions are implanted, drain and source regions 82 and 84 having an opposite conductivity type to that of channel region 80. Each channel column 80 is divided into separate channel regions that are isolated by field oxide islands 105. Alternatively, for depletion type cells, the channel 80 is of the same conductivity type as the more heavily doped drain 82 and source 84. Generally rectangular floating gates 88 are disposed above portions of the channel, adjacent to the drain 82. Disposed above the floating gates 88 in stripes generally perpendicular to the source 84 and drain 82 are split gates 92. Note that drain 82 and source 84 are operationally interchangeable.

Figure 7:
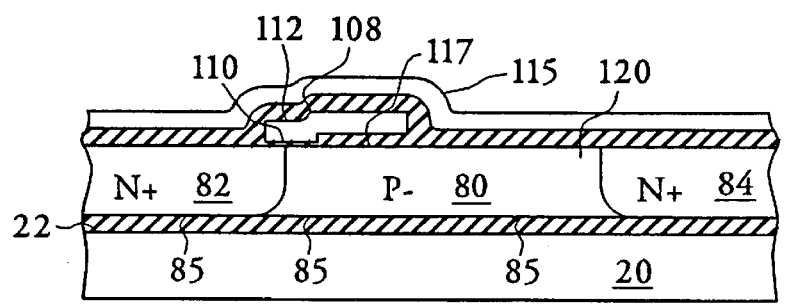
FIG. 7 is a cross-sectional view of a split gate silicon on insulator EEPROM of the present invention with a small tunnel oxide window.

FIG. 7 shows a split gate embodiment much like that discussed above, except that a floating gate 108 of this embodiment has a tunnel oxide window or stripe 110 that separates a dip down portion 112 of the floating gate 108 from the active layer 85. The tunnel oxide window or stripe 110 has a thickness in a range between 50 and 150 angstroms to allow for tunneling of electrons between the drain 82 and the floating gate 108. A split gate 115 of this embodiment lies over both the floating gate 108 and the channel 80. The channel 80 thus has a first portion 117 which is disposed under and affected primarily by the floating gate 108, and a second portion 120 that is disposed under and affected primarily by the split gate 115. Assuming as before that the channel 80 is p-type silicon and the source 84 and drain 82 are n-type, both the floating gate 108 and the split gate 115 need to be at a high voltage to cause a conductive layer of electrons to form across both portions 117 and 120 of the channel 80 to allow current to flow from the source to the drain. Note that the embodiments shown in FIGS. 4–7 may be an EPROM rather than EEPROM memory cell and array, the EPROM being erased by exposure to ultraviolet light from above, which creates electron-hole pairs in silicon dioxide to allow discharge from the gate.

Figure 8:
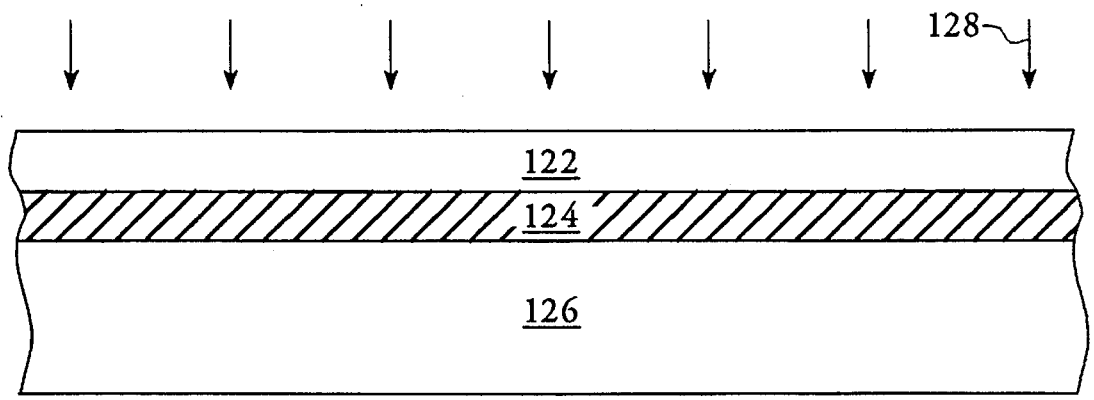
FIG. 8 is a buried insulator implanting step in a process of making the EEPROM cell of FIG. 1.

Referring now to FIG. 8 a process for forming nonvolatile memory cells of the present invention begins with forming a high quality crystalline semiconductor layer 122 atop an insulative layer 124 which is in turn atop a semiconductor substrate 126. A preferred method for creating the buried insulative layer 124 is implantation of high energy oxygen or nitrogen ions, as shown by arrows 128, to create an insulative layer 124 composed of either oxide or nitride, respectively. In order to create a buried oxide layer, a high dose (at least $2 \times 10^{18}$ ions/cm$^2$) of high energy (150–200 keV) oxygen ions is directed at a silicon wafer which is heated to approximately 400° C. This creates a layer of silicon dioxide 124 having a peak concentration that may be 0.3 to 0.7 μm in depth. A nitrogen anneal is then performed to remove oxygen from the surface layer and to recrystallize the silicon layer 122, followed by slow cooling to ensure formation of a single crystal lattice near the surface of that layer 122, which may be only 0.1 to 0.5 μm in thickness at that time. An epitaxial layer of single crystal silicon may then be grown to bring the single crystal silicon layer 122 to a desired thickness, which may be 0.5 to 1.5 μm. The silicon layer 122 may then be lightly doped with boron or arsenic to make the layer p-type or n-type, respectively, after which it is again annealed.

Figure 9:
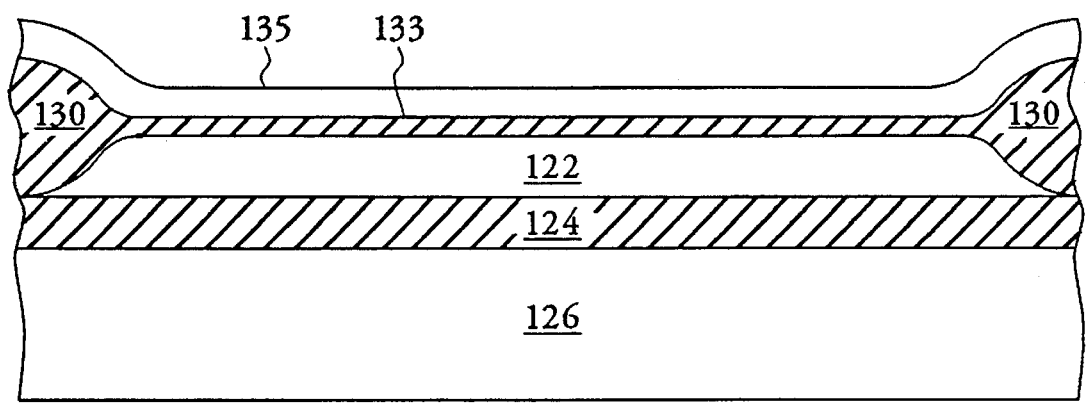
FIG. 9 is a tunnel oxide and floating gate layer formation step in the process of FIG. 8.

Referring now to FIG. 9, a layer of oxide is deposited on the surface of the silicon layer 122, after which active areas are defined by a mask and coated with nitride, areas which are not masked then being grown with field oxide 130. The field oxide 130, which may be in rows or islands or other formations depending upon the eventual circuit array to be formed, is seen to extend completely through the silicon layer 122 to isolate that layer. Atop the lightly doped layer of silicon 122 is grown a thin (50–150 Å thickness) thermal oxide layer 133, which is to become a gate dielectric layer. On top of thermal oxide layer 133 is deposited a polysilicon gate layer 135, which is doped for conductivity and which will become a floating gate.

Figure 10:
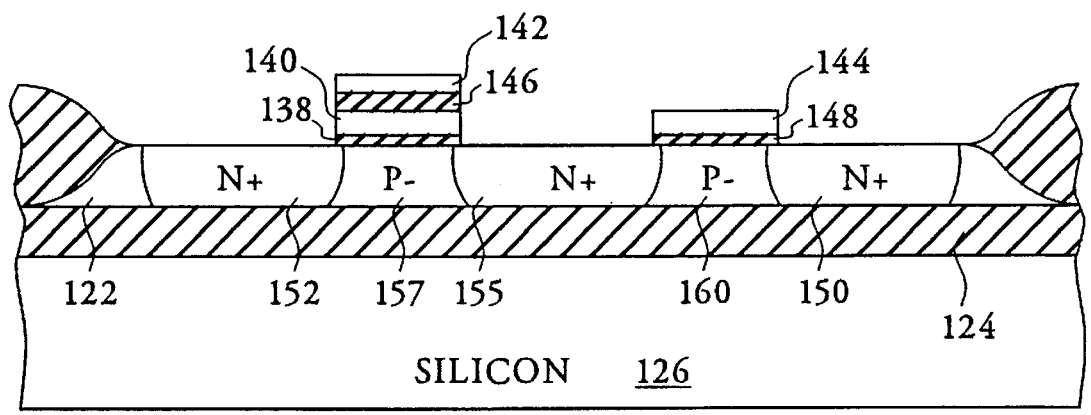
FIG. 10 is a mask, etch and self-aligned implant step in the process of FIG. 8.

As shown in FIG. 10, the oxide layer 133 and polysilicon layer 135 have been masked and etched to form a thin tunnel oxide layer 138 separating a floating gate 140 from the silicon layer 122. Another, thicker (150–500 Å) layer of oxide has been formed over the floating gate and the silicon 122, on top of which a second polysilicon layer has been formed, masked and etched to create a control gate 142 and a select gate 144, which are disposed atop an insulative interpoly layer 146 and select oxide layer 148. Heavily doped self aligned source 150, drain 152 and combined source/drain 155 regions of an opposite conductivity type to that of the lightly doped silicon layer 122 are then formed by ion implantation. If, for instance, the silicon layer 122 had been originally doped with boron to form p-type silicon, the self aligned doping may then be performed with arsenic to form n-type source and drain regions 150, 152 and 155. The remaining regions of lightly doped p-type silicon beneath the floating gate 140 and the select gate 144 become channels 157 and 160 whose conductivity is controlled by the electrical status of their respective overlying gates 140 and 144.

Figure 11:
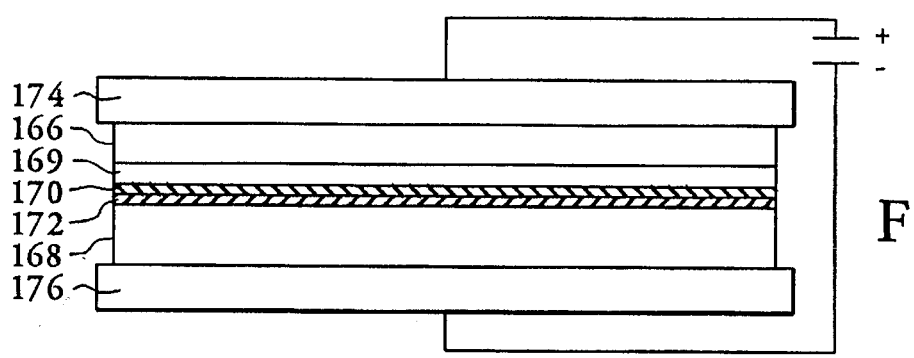
FIG. 11 is a wafer bonding step in a process of making the EEPROM cell of FIG. 4.

FIG. 11 shows another method for forming a nonvolatile memory device of the present invention, beginning with thermally growing oxide coatings on a pair of wafers and then bonding the oxide coating of the wafers together to form a buried oxide layer. In this embodiment, a first silicon wafer 166 and a second silicon wafer 168 have been subjected to an oxygen ambient at around 700° C. to grow oxide layers 170 and 172, after an etch stop layer 169 of boron or arsenic has been implanted in the first wafer 166. The wafers 166 and 168 are then brought together as shown in FIG. 11 with their oxide layers 170 and 172 adjoining. The wafers 166 and 168 are lightly held between electrodes 174 and 176 at an elevated temperature (1100°–1200° C.) and a high voltage (around 20 V) is applied between the electrodes 174 and 176, which induces bonding between the oxide layers 170 and 172.

Figure 12:
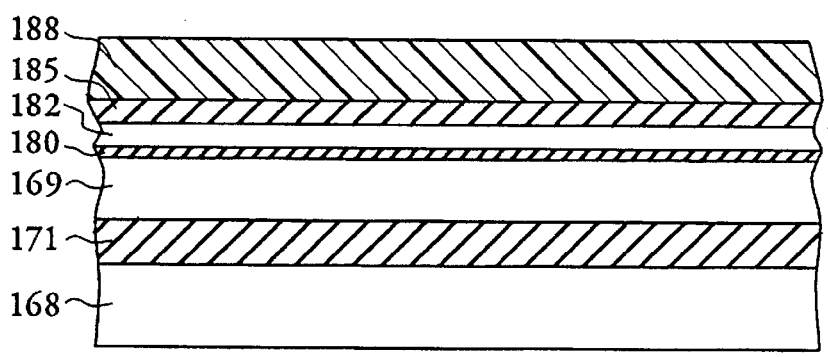
FIG. 12 is a tunnel oxide, floating gate and photoresist layer formation step of the process of FIG. 11.

In FIG. 12, the wafers 166 and 168 are shown after bonding, and after the wafer 166 has been etched to leave etch stop layer 169. Oxide layer 171, which was formed from the bonding of oxide layers 170 and 172, lies buried beneath silicon layer 169, while a thin layer of high quality thermal oxide 180, which may be between 50 and 150 angstroms in thickness, is grown over silicon layer 169. Previous to the growth of thermal oxide layer 180, field oxide islands, not shown, were grown while active areas shown in this figure were masked. A first polysilicon layer 182 has been formed atop the thermal oxide layer 182 and is doped with an n-type dopant for conductivity. Atop the first polysilicon layer 182 is formed an interpoly layer 185, which is then covered with a photoresist 188.

Figure 13:
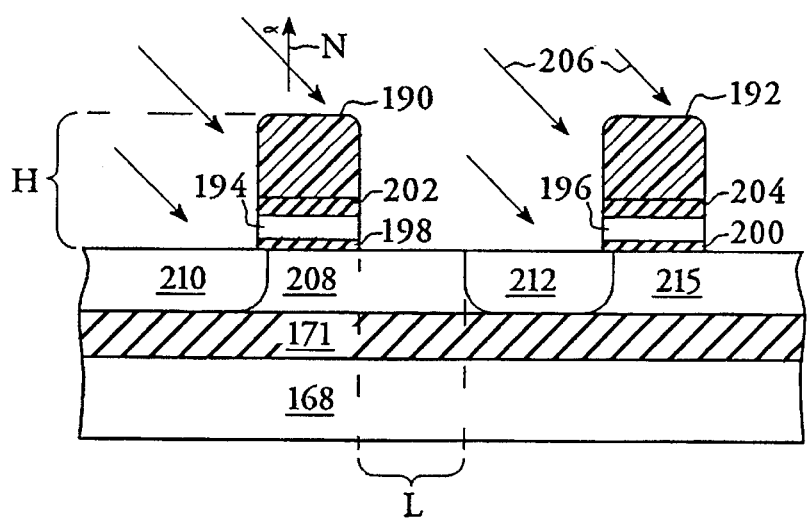
FIG. 13 is a mask, etch and self-aligned implant step of the process of FIG. 11.

In FIG. 13 the photoresist has been developed to leave masks 190 and 192, while the layers below the photoresist that were not covered with masks 190 or 192 have been etched away, leaving floating gates 194 and 196 disposed between tunnel oxide layers 198 and 200 and interpoly oxides 202 and 204, respectively. Self aligned buried conductive regions are then formed with a high angle ion implant as depicted by arrows 206, a height H of a top of the photoresist masks 190 and 192 and an angle α of the implanting ions 206 relative to normal N determining a length L of a portion of a channel 208 which will lie under a split gate. Source/drain regions 210 and 212 are formed above oxide layer 171 by the implantation and subsequent annealing and diffusion which may be performed, leaving part of an adjacent channel 215 under floating gate 196.

Figure 14:
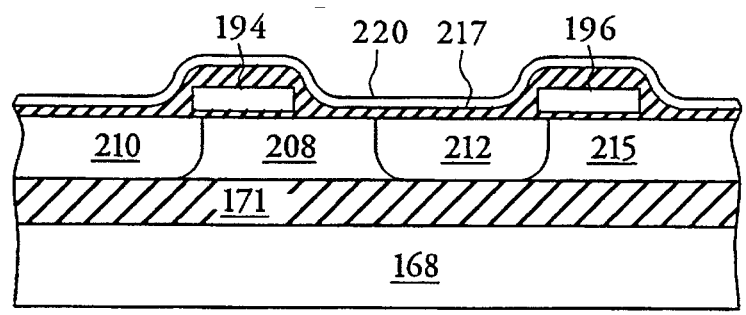
FIG. 14 is an interpoly and split gate formation step of the process of FIG. 11.

Referring now to FIG. 14, the photoresist masks 190 and 192 of the previous figure have been removed and an oxide layer 217 which has a thickness in a range between 200 and 1000 angstroms has been formed below a second polysilicon layer 220 which extends over portions of the channels 208 and 215 and the floating gates 194 and 196. Thus second polysilicon layer 220 serves as a split gate that can influence the charging and discharging of floating gate 194 and the conduction of channel 208. The insulative layer 171 is particularly helpful in this embodiment in avoiding punch-through and latchup problems between adjacent memory cells such as represented by floating gates 194 and 196 and respective channels 208 and 215.

I claim:

1. A nonvolatile memory device comprising:

a self-supporting planar substrate having an insulative layer thereon, a semiconductive layer disposed atop said insulative layer and having a source region separated from a drain region by a channel region, a first dielectric layer having a first part and a second part, said first part forming a tunnel window having a thickness in the range between 50 and 150 angstroms and being partially disposed over said drain region and a section of said channel region, said second part forming a gate oxide disposed atop said semiconductive layer exclusive of said tunnel window, said second part having a thickness at least three times as thick as said tunnel window, a conductive floating gate disposed atop said channel region and separated from said semiconductive layer by said first dielectric layer, a second dielectric layer disposed atop said floating gate, and a conductive control gate disposed atop said second dielectric layer, and a first means for providing electrical signals only to said source region, second and third means for providing electric signals to said drain region and said conductive control gate, respectively.

2. The device of claim 1 wherein said first means for providing electrical signals to said source region includes a select gate separated from said source region by a third dielectric layer.

3. The device of claim 1 wherein said means for providing electrical signals to said source region includes a select gate separated from said source region by at least one of said first and second dielectric layers.

4. The device of claim 1 wherein said semiconductive layer is composed primarily of a single crystal.

5. The device of claim 1 wherein said semiconductive layer and said insulative layer have substantially equal thicknesses.

6. An EEPROM memory device comprising:

a self-supporting planar substrate, at least a top layer of which is electrically insulative, a semiconductive layer disposed atop said substrate and having a source region separated from a drain region by a channel region, a first dielectric layer having a first part and a second part, said first part forming a tunnel window having a thickness in the range between 50 and 150 angstroms and being partially disposed over said drain region and a section of said channel region, said second part forming a gate oxide disposed atop said semiconductive layer exclusive of said tunnel window, said second part having a thickness at least three times as thick as said tunnel window, a conductive floating gate disposed atop said channel region and separated from said semiconductive layer by said first dielectric layer, a second dielectric layer disposed atop said conductive floating gate, a conductive control gate separated from said floating gate by said second dielectric layer, and first, second and third means for providing electrical signals only to said source region, said drain region and said control gate, respectively.

7. The device of claim 6 wherein said first means for providing electrical signals to said source region includes a select gate separated from said source region by a third dielectric layer.

8. The device of claim 6 wherein said first means for providing electrical signals to said source region includes a select gate separated from said source region by at least one of said first and second dielectric layers.

9. The device of claim 6 wherein said semiconductive layer is composed primarily of a single crystal.

10. The device of claim 6 wherein said semiconductive layer has a thickness less than 1 micron.

11. The device of claim 6 wherein said channel is elongated and said control gate extends in a field effect relationship over a portion of said channel longitudinally separated from said floating gate.

* * * * *